United States Patent [19]
Fréchet et al.

[11] Patent Number: 5,648,196
[45] Date of Patent: Jul. 15, 1997

[54] WATER-SOLUBLE PHOTOINITIATORS

[75] Inventors: Jean M. J. Fréchet, Ithaca, N.Y.; Sang-Yeon Shim, Seoul, Rep. of Korea

[73] Assignee: Cornell Research Foundation, Inc., Ithaca, N.Y.

[21] Appl. No.: 502,400

[22] Filed: Jul. 14, 1995

[51] Int. Cl.$^6$ .................... G03C 1/492; G03C 1/494; G03C 5/00; C08F 2/46

[52] U.S. Cl. .................... 430/270.1; 430/296; 430/311; 430/313; 430/325; 430/326; 430/330; 430/921; 522/31; 522/129; 522/146; 522/160; 522/166; 522/88

[58] Field of Search ................ 430/270.1, 311, 430/325, 326, 330, 313, 296, 921; 522/31, 129, 146, 160, 166, 88

[56] References Cited

U.S. PATENT DOCUMENTS

| | | | |
|---|---|---|---|
| 4,058,400 | 11/1977 | Crivello | 96/86 |
| 4,136,102 | 1/1979 | Crivello | 260/440 |
| 4,161,478 | 7/1979 | Crivello | 260/327 |
| 4,175,972 | 11/1979 | Crivello | 204/159.18 |
| 4,219,654 | 8/1980 | Crivello | 546/342 |
| 4,238,619 | 12/1980 | Crivello et al. | 549/3 |
| 4,273,668 | 6/1981 | Crivello | 252/182 |
| 4,407,759 | 10/1983 | Crivello | 260/440 |
| 4,417,061 | 11/1983 | Crivello | 549/3 |
| 4,537,854 | 8/1985 | Crivello | 430/283 |
| 4,610,952 | 9/1986 | Crivello | 430/325 |
| 4,657,845 | 4/1987 | Frechet et al. | 430/326 |
| 4,882,201 | 11/1989 | Crivello et al. | 427/54.1 |
| 5,034,305 | 7/1991 | Nguyen-Kim et al. | 430/270 |
| 5,035,979 | 7/1991 | Nguyen-Kim et al. | 430/270 |
| 5,045,128 | 9/1991 | Landreth et al. | 148/23 |
| 5,073,474 | 12/1991 | Schwalm et al. | 430/270 |
| 5,084,371 | 1/1992 | Schwalm et al. | 430/270 |
| 5,130,392 | 7/1992 | Schwalm et al. | 526/288 |
| 5,159,088 | 10/1992 | Schwalm | 549/3 |
| 5,191,124 | 3/1993 | Schwalm et al. | 568/18 |
| 5,216,135 | 6/1993 | Urano et al. | 534/556 |
| 5,220,037 | 6/1993 | Schwalm et al. | 549/78 |
| 5,260,410 | 11/1993 | Schwalm | 528/196 |
| 5,262,280 | 11/1993 | Knudsen et al. | 430/280 |
| 5,296,332 | 3/1994 | Sachdev et al. | 430/270 |
| 5,314,929 | 5/1994 | Crivello et al. | 522/31 |
| 5,318,876 | 6/1994 | Schwalm et al. | 430/270 |
| 5,322,765 | 6/1994 | Clecak et al. | 430/326 |
| 5,326,675 | 7/1994 | Niki et al. | 430/326 |
| 5,532,106 | 7/1996 | Frechet et al. | 430/191 |
| 5,532,113 | 7/1996 | Frechet et al. | 430/296 |

OTHER PUBLICATIONS

English Translation of JP-1-287558, Hirose, 1989.

E. Goethals et P. de Radzitzky; Réactions Du Sulfoxyde De Diméthyle, *Bull. Soc. Chim. Belg.* 73, pp. 546-559 (1964). Abstract.

E. Goethals et P. de Radzitzky; Réactions Du Sulfoxyde De Diméthyle, *Bull. Soc. Chim. Belg.* 73, pp. 579-584 (1964). Abstract.

S.A. MacDonald et al; Chemical Amplification in High-Resolution Imaging Systems, *Acc. Chem. Res.* 27 No. 6, pp. 151-158 (1994).

(List continued on next page.)

*Primary Examiner*—George F. Lesmes
*Assistant Examiner*—Bernard P. Codd
*Attorney, Agent, or Firm*—Bell, Seltzer, Park & Gibson

[57] ABSTRACT

The present invention provides positive-tone and negative-tone photoresists including a photoinitiator comprising a compound of Formula (I):

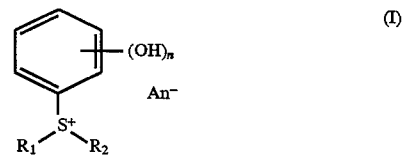

wherein $R_1$ and $R_2$ are independently selected from $C_1$-$C_6$ alkyl; n is a number from 2 to 5, and $An^-$ is an anion. The photoinitiator comprising the compound of Formula (I) being soluble in water. Methods of preparing positive-tone and negative-tone photoresists are also provided.

45 Claims, 3 Drawing Sheets

Comparison of sensitivities for photoinitiators
Poly(4-hydroxystyrene)/xylose/PI(2) = 100/5/10
PEB = 120°C/5min ( ▣ ),
130°C/5min ( ▤ )
Poly(4-hydroxystyrene)/xylose/PI(5) = 100/5/10
PEB = 120°C/5min ( ▲ ),
130°C/5min ( × ).

OTHER PUBLICATIONS

Jean M.J. Fréchet; The photogeneration of acid and base within polymer coatings: Approaches to polymer curing and imaging, *Pure & Appl. Chem.* 64 No. 9, pp. 1239–1248 (1992).

Hiroshi Ito; Aqueous base developable deep UV resist systems based on novel monomeric and polymeric dissolution inhibtors, *SPIE* 920 pp. 33–41 (1988).

T. Sakamizu et al; Water-soluble onium salts—A new class of acid generators for chemical amplification positive resists, *PMSE* 72 pp. 199–200 (1995).

G. Pawlowski et al; Chemically Amplified Duv Photoresists Using a New Class of Photoacid Generating Compounds, *SPIE* 1262, pp. 16–25 (1990).

J. L. Dektar and N. P. Hacker; Triphenylsulfonium Salt Photochemistry. New Evidence for Triplet Excited State Reactions, *J. Org. Chem.* 53, 1833–1835 (1988).

J.V. Crivello; Initiators–Poly–Reactions–Optical Activity: Cationic Polymerization—Iodonium and Sulfonium Salt Photoinitiators, *Advances in Polymer Science* 62 pp. 1–48 (1984).

J.V. Crivello and J.H.W. Lam; Photoinititated Cationic Polymerization by Dialkyl–4–Hydroxyphenylsulfonium Salts, *Journal of Polymer Science* 18, pp. 1021–1034 (1980).

F.M. Houlihan et al; Synthesis of 4-(t-butoxycarbonyl)-2,6-dinitrobenzyl Tosylate, a Potential One Component Photoacid Generator and Dissolution Inhibitor Solubilizable Through Chemical Amplification, *Polym. Mater. Sci. Eng.* 66, pp. 38–40 (1992).

R. Schwalm; Success: A Novel Concept Regarding Photoactive Compounds, *Proc. Polym. Mater. Sci. Eng.* 61, pp. 278–282 (1989).

Figure 1. Comparison of sensitivities for photoinitiators
   Poly(4-hydroxystyrene)/xylose/PI(2) = 100/5/10
      PEB = 120°C/5min ( ▣ ),
              130°C/5min ( ▣ )
   Poly(4-hydroxystyrene)/xylose/PI(5) = 100/5/10
      PEB = 120°C/5min ( ▲ ),
              130°C/5min ( × ).

Figure 2. Sensitivity curves for photoresists
Poly(4-hydroxystyrene)/xylose/PI(2) = 100/5/5
PEB = 130°C/2min ( ◉ ),
130°C/5min ( ◉ )
Poly(4-hydroxystyrene)/xylose/PI(2) = 100/5/10
PEB = 130°C/2min ( ▲ ),
130°C/5min ( × ).

Figure 3. Effects of developers
Poly(4-hydroxystyrene)/xylose/PI(2) = 100/5/10
PEB = 120°C/5min
30 % MF-312, 30 sec ( ⊙ )
20 % MF-312, 30 sec ( ■ )
90 sec ( × )
120 sec ( △ ).

WATER-SOLUBLE PHOTOINITIATORS

FIELD OF THE INVENTION

The present invention relates to the lithography field, and more particularly to photoinitiators for photoresists.

BACKGROUND OF THE INVENTION

The electronic and photographic or photolithographic industries have historically employed organic solvents, acids, and salts. With increasing demands for decreased use of toxic chemicals including a variety of organic products, research in virtually all organic chemical based industries has shifted focus to the development of more environmentally compatible alternatives to organic chemicals. In the electronics, and photographic or photolithographic industries, few alternatives have been provided for the typically organic components of photoresists. In particular, there is a need in the art for environmentally compatible photoinitiators useful in photoresists.

Photoinitiators are known in the art, and typically include compounds whose chemical composition is altered upon exposure to radiation. Examples of well known photoactive agents include sulfonium and iodonium salts, such as those described in U.S. Pat. Nos. 4,407,759, 4,417,061, and 4,537,854 all to Crivello; and J. M. J. Fréchet, Pure and Applied Chemistry 63(9):1239 (1992). More recently, Sakamizu, et al., *Polymeric Materials Science and Engineering*, American Chemical Society 72:199 (1995), discussed tri(alkylsulfonyloxy)benzene salts as one class of water-soluble onium salt photoacid generators. There remains a need in the art for alternative photoinitiators which are useful in photoresist compositions, and environmentally compatible. In addition, there remains a need in the art for photoinitiators which are water-soluble.

SUMMARY OF THE INVENTION

As a first aspect, the present invention provides a water-soluble photoinitiator.

As a second aspect, the present invention provides a photoinitiator comprising a compound of Formula (I):

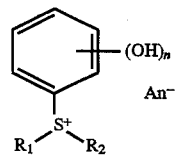

wherein $R_1$ and $R_2$ are independently selected from $C_1$–$C_6$ alkyl, particularly methyl; n is a number from 2 to 5, and $An^-$ is an anion. The photoinitiator comprising the compound of Formula (I) being soluble in water.

As a third aspect, the present invention provides a photoresist comprising a polymer, a crosslinking agent, and a water-soluble photoinitiator comprising a compound of Formula (I).

As a fourth aspect, the present invention provides a method of preparing microelectronic structures comprising the steps of (a) placing on a microelectronic substrate, a photoresist comprising a polymer, a crosslinking agent, and a water-soluble photoinitiator comprising a compound of Formula (I); (b) irradiating predetermined sites of the photoresist to activate the photoinitiator at the predetermined sites, and to create exposed and unexposed sites of the photoresist; (c) heating the photoresist; and (d) removing matter from the unexposed sites to provide a microelectronic structure.

As a fifth aspect, the present invention provides a method of making a negative-tone photoresist comprising combining a polymer, a crosslinking agent, and a water-soluble photoinitiator comprising a compound of Formula (I).

As a sixth aspect, the present invention provides a 3-component positive-tone photoresist comprising a polymer, a dissolution inhibitor, and a water-soluble photoinitiator comprising a compound of Formula (I).

As a seventh aspect, the present invention provides a 2-component positive-tone photoresist comprising a polymer, and a water-soluble photoinitiator comprising a compound of Formula (I).

As a eighth aspect, the present invention provides a method of making microelectronic structures comprising the steps of: (a) placing on a microelectronic substrate, a photoresist comprising a polymer, a dissolution inhibitor, and a water-soluble photoinitiator comprising a compound of Formula (I); (b) irradiating predetermined sites of the photoresist to activate the water-soluble photoinitiator at the predetermined sites, and to create exposed and unexposed sites of the photoresist; (c) heating the photoresist; and (d) removing matter from the unexposed sites to provide a microelectronic structure.

As a ninth aspect, the present invention provides a method of making a positive-tone photoresist comprising a polymer and a water-soluble photoinitiator comprising a compound of Formula (I).

As a tenth aspect, the present invention provides a method of generating an acid in a photoresist, comprising exposing the photoresist to radiation, wherein the photoresist includes a water-soluble photoinitiator of Formula (I).

The foregoing and other aspects of the present invention are explained in detail in the detained description set forth below.

DETAILED DESCRIPTION OF THE INVENTION

Figure 1:
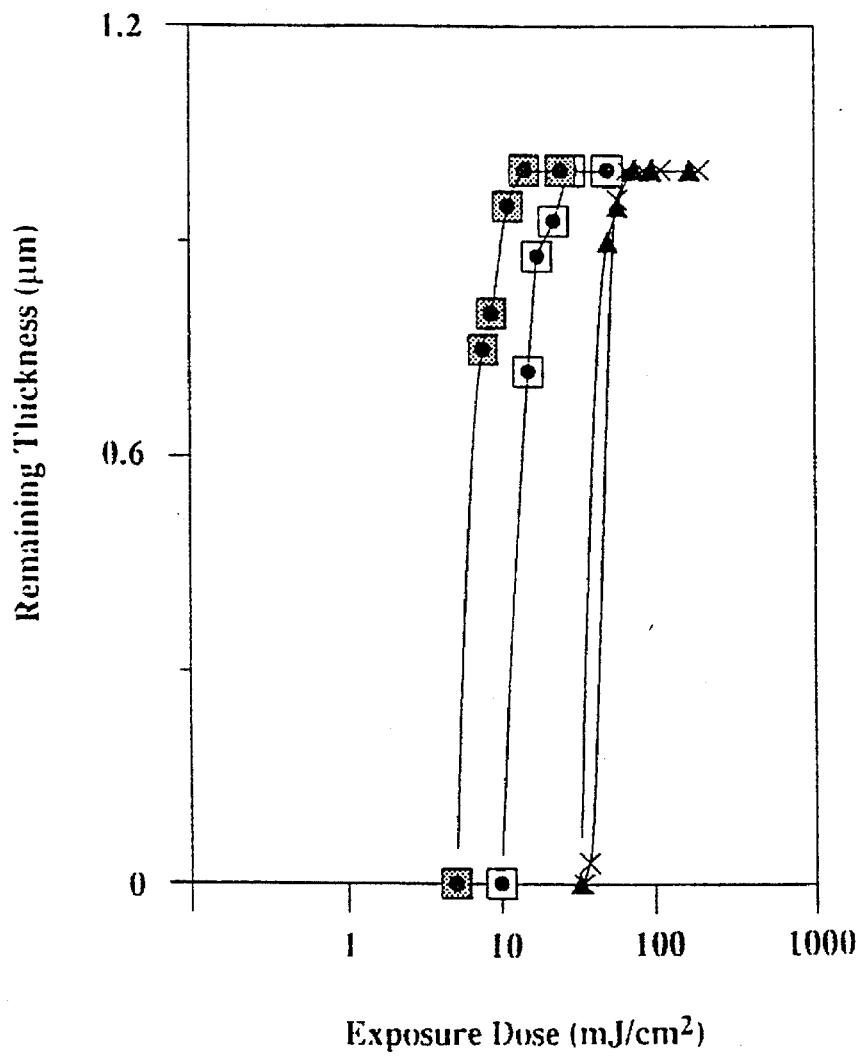
FIG. 1 is a graphical representation of the effects of structure changes of the photoinitiator on photoresist sensitivity.

As used herein, the term "photoinitiator" refers to a compound which initiates a reaction upon exposure to radiation. Photoinitiators include a wide range of compounds, including "photoactive agents," which are compounds whose chemical composition is altered upon exposure to radiation. One preferred class of photoactive agents includes "photoacid generators", which are compounds which produce acid upon exposure to radiation. Photoinitiators, photoactive agents, and photoacid generators are useful in both the formation of positive-tone and negative-tone photoresists.

As described above, the photoinitiators of the present invention are soluble in water, and include compounds of Formula (I):

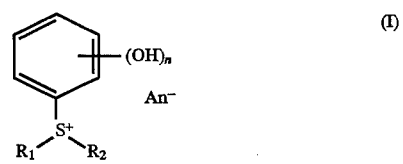

wherein $R_1$ and $R_2$ are independently selected from $C_1$–$C_6$ alkyl, particularly methyl; n is a number from 2 to 5, and $An^+$ is an anion. The photoinitiators of the present invention are useful as photoactive agents, and photoacid generators in both positive-tone and negative-tone photoresists.

The preferred photoinitiator compounds of Formula (I) are those compounds wherein, $R_1$ and $R_2$ are both $C_1$–$C_3$ alkyl, more preferably $C_1$–$C_2$ alkyl, and are most preferably methyl. Typically, the preferred photoinitiator compounds of Formula (I) include compounds wherein n is 2–4, more preferably compounds wherein n is 2 or 3, and most preferably compounds wherein n is 2. In the preferred compounds of the present invention, both $R_1$ and $R_2$ are methyl and n is 2 or 3, more preferably 2.

The compounds of Formula (I) generally define alkyl-hydroxysulfonium salts, wherein $An^-$ provides the anionic portion of the salt form. Suitable salt forms of a variety of sulfonium salts are known, and $An^-$ in Formula (I) above may be any anionic portion suitable for forming such known sulfonium salt forms. For example, $An^-$ is selected from the group consisting of halide, such as fluoride, chloride, bromide, or iodide; hexafluorophosphate; trifluoromethanesulfonate ("triflate"); hexafluoroantimonate; hexafluoroarsenate; and tetrafluoroborate. Preferably, $An^-$ is selected from the group consisting of triflate, hexafluoroantimonate, and hexafluoroarsenate.

The preferred water-soluble photoinitiators of the present invention include dimethyl-dihydroxyphenylsulfonium triflate, dimethyl-dihydroxyphenylsulfonium chloride, dimethyl-trihydroxyphenylsulfonium triflate, and dimethyl-trihydroxyphenylsulfonium chloride. Preferably, the photoinitiator comprises dimethyl-trihydroxyphenylulfonium triflate.

The photoinitiators of the present invention are useful in methods of generating an acid in a photoresist. The present invention provides such a method, which comprises irradiating the photoresist with radiation, wherein the photoresist includes a photoinitiator having the Formula (I) above. The photoresist may be irradiated with any suitable form of radiation, including but not limited to ultraviolet, deep-ultraviolet, infrared, electron beam, x-ray, and ion beam radiation.

Without wishing to be bound by any particular theory, it is believed that the photolysis of dimethyl-multihydroxyphenylsulfonium salts proceeds according to Scheme 1 below.

Scheme 1

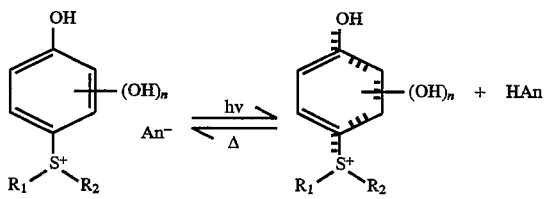

The foregoing mechanism demonstrates the reversible photogeneration of the ylid and the acid. The resonance stabilized energy of the ylid affects the decomposition rate of the multihydroxyphenylsulfonium salts.

As indicated above, the photoinitiators of the present invention may be useful in photoresists according to the present invention. For example, the present invention provides a negative-tone photoresist. The negative-tone photoresist may be of any suitable formulation known to those skilled in the art, which includes a photoinitiator. Typically, negative-tone photoresists according to the present invention comprise a polymer, a crosslinking agent, and a water-soluble photoinitiator comprising a compound of Formula (I).

The polymers useful in the photoresists of the present invention include those polymers known in the art for use in forming photoresists. Preferably, the polymers will be transparent in at least a portion of the ultraviolet region of the electromagnetic spectrum. As used herein, the term "transparent" refers to the degree of transmission through a 0.001 mm thickness of polymer which essentially has a percent transparency of not less than 50% in the wavelengths between about 245 nm and about 440 nm. Preferably, a 0.001 mm thick sample of the polymer has a percent transparency of not less than 50% at one or more of the following wavelengths: 248 nm, 254 nm, 313 nm, 365 nm, and 456 nm.

Generally, polymers which are useful in the present invention are soluble in water or in aqueous base developing solution. Typically, suitable polymers include polymers containing ethylenic unsaturation or aromatic rings. Examples of useful polymers include, but are not limited to, poly (hydroxystyrene), novolak, poly(p-t-butyoxycarbonyloxystyrene), polyvinylbenzoic acid, poly(2-hydroxyhexafluoropropyl styrene), copolymers of styrene and hydroxystyrene, copolymers of styrene and maleimide as described in S. R. Turner et al., Polym. Sci & Eng. 26(16):1096 (1986), the disclosure of which is incorporated herein by reference in its entirety, copolymers of styrene and t-butoxycarbonyloxystyrene, copolymers of hydroxystyrene and t-butoxycarbonyloxystyrene, and mixtures or copolymers of any two or more of the foregoing polymers. Preferably, the polymer is poly(hydroxystyrene), poly(t-butoxycarbonyloxystyrene) or novolak.

As crosslinking agents, the photoresists of the present invention may employ any suitable crosslinking agent known to those skilled in the art which is capable of crosslinking the polymer. Examples of suitable crosslinking agents include poly(hydroxymethyl) aromatic compounds such as poly(hydroxy)methyl phenols, poly(hydroxymethyl) bisphenols, and hydroxymethylated novolac. Specific examples of poly(hydroxymethyl) aromatic compounds which are useful as crosslinking agents include but are not limited to 2,6-bishydroxymethylphenol, 2,4-bishydroxymethylphenol, bis-hydroxymethyl-bisphenol A, and 1,3,5-trihydroxymethylbenzene. Other suitable crosslinking agents are described in my copending patent application Ser. No. 08/309,864, filed 21 Sep. 1994, the disclosure of which is incorporated herein by reference in its entirety. Preferred crosslinking agents include xylose, mannose, glucose, 2,6-bishydroxymethylphenol, and 2,4-bishydroxymethylphenol.

One preferred negative-tone photoresist comprises poly (4-hydroxystyrene), xylose, and dimethyl-2,4-dihydroxyphenylsulfonium triflate.

The negative-tone photoresist may be formed according to methods known to those skilled in the art. Namely, the photoresist may be provided alone, as a sheet or film. More preferably, the photoresist is formed on a microelectronic substrate. Suitable substrates are known to those skilled in the art. For example, the photoresist may be formed as a coating on a monocrystalline silicon or other semiconductor substrate. Other suitable substrates include printed circuit boards or other second level packaging substrates. Suitable methods of coating the photoresist on the substrate will be known to those skilled in the art. For example, the photoresist may be coated on a substrate using spin-coating techniques which are well known in the art. Spin-coating is the preferred method of coating the photoresist on a substrate, although alternative methods such as thin film casting, known to those skilled in the art are contemplated by the present invention as well.

The formed photoresist is then irradiated at predetermined sites using a suitable mask, to activate the photoinitiator at the predetermined sites. Irradiation at predetermined sites creates exposed and unexposed sites on the photoresist.

Typical structures formed by this process, depending on the predetermined sites irradiated, include various microelectronic structures such as transistors or integrated circuit chips, boards, and the like. Any suitable form of radiation known to those skilled in the art may be employed in the method of the present invention. Preferably, the form of radiation employed will be dependent upon the transmission properties of the polymer selected. That is, the polymer selected should be essentially transparent to the wavelength of radiation which is to be employed. Suitable forms of radiation include ultraviolet, infrared, deep-ultraviolet, electron beam, X-ray, and ion beam. Preferably, the photoresist is irradiated with ultraviolet, deep-ultraviolet, electron-beam, X-ray, or ion beam radiation.

After radiation exposure, the photoresist is subjected to post-exposure baking. Post-exposure baking involves heating the photoresist to a sufficient temperature to provide the activation energy necessary to initiate crosslinking. Crosslinking is initiated by the acid formed by exposure of the compound of Formula (I) to radiation. The appropriate heating conditions for post-exposure baking are necessary for optimal performance of the resist. Improper heating conditions may have a negative impact on the sensitivity of the resist. Typically, the photoresist is heated at between about 90° C. to about 150° C. for between about 15 seconds to about 15 minutes. Preferably, the photoresist is heated at about 130° C. to about 140° C. for between about 30 seconds to about 5 minutes, more preferably for about 1 minute to about 3 minutes.

After heating the photoresist, matter is removed from the unexposed sites. The removal of matter from the unexposed sites may be accomplished by any means known to those skilled in the art. Typically, matter is removed from the unexposed sites by subjecting the resist to a developing medium, in which matter from the unexposed sites is solubilized. Preferably, inasmuch as the polymers useful in the present invention are generally soluble in water or in aqueous base, the photoresist may be developed in aqueous base developing solution such as solutions comprising sodium hydroxide, potassium hydroxide, sodium carbonate, and various tetraalkylammonium hydroxides such as tetramethylammonium hydroxide and tetrabutyl ammonium hydroxide, or in water.

Several suitable developing techniques will be apparent to those skilled in the art. According to one developing technique, the photoresist is immersed and agitated in a bath of developing solution maintained at a predetermined temperature for a predetermined period of time. According to a second developing technique, the developing solution is sprayed across the surface of the photoresist. Yet another suitable developing technique is the puddle technique, whereby a fixed amount of developer is dispensed on the photoresist and after a period of time, the developing solution is removed by directing a stream of deionized water onto the developed photoresist. Other suitable techniques will be readily determined by those skilled in the art.

The present invention also provides a positive-tone photoresist. The positive-tone photoresist may be of any suitable 2- or 3-component formulation known to those skilled in the art, which includes a photoinitiator. A typical 2-component positive-tone photoresist comprises a polymer and a water soluble photoinitiator comprising a compound of Formula (I). A typical, 3-component positive-tone photoresist according to the present invention comprises a polymer, a dissolution inhibitor, and a water-soluble photoinitiator comprising a compound of Formula (I).

Suitable polymers for use in the positive-tone photoresists of the present invention are described above. The dissolution inhibitor employed in the 3-component resist formulation may be any suitable dissolution inhibitor known to those skilled in the art. For example, suitable dissolution inhibitors are described in S. MacDonald, et al., Accounts of Chemical Research 27:151 (1994), the disclosure of which is incorporated herein by reference in its entirety. Specific examples of suitable dissolution inhibitors include but are not limited to t-butoxycarbonyloxy derivatives of alcohols, phenols, and bisphenols; t-butyl esters of carboxylic acids; and t-butyl ethers of alcohols or phenols. Specific examples of suitable dissolution inhibitors include but are not limited to bis-t-butoxycarbonyloxy bisphenol A, t-butyloxynaphthalene, t-butylnaphthoate, t-butylnaphthylether, t-butoxycarbonyloxy derivatives of steroids, bis-t-butyloxycarbonyloxy bisphenol A, 4,4'-bis-t-butyloxycarbonyloxy diphenylsulfone, and bis-(4-t-butyloxycarbonyloxyphenyl)phenylsulfonium hexafluoroantimonate. One preferred dissolution inhibitor is bis-t-butyloxycarbonyloxy bisphenol A.

Other suitable dissolution inhibitors include diester dissolution inhibitors which are described in my patent application Ser. No. 08/299,213, filed 31 Aug. 1994, now U.S. Pat. No. 5,532,106, the disclosure of which is incorporated herein by reference in its entirety. For example, suitable diester dissolution inhibitors include (4-methylphenyl)methanediol dipropionate, (4-methylphenyl)methanediol dibenzoate, phenylmethanediol bis(phenylacetate), phenylmethanediol bis(diphenylacetate), (4-acetyloxyphenyl)methanediol, bis(diphenyl-acetate), phenylmethanediol bis (2,4,6-trimethylbenzoate), ((4-methoxyphenyl)methanediol bis(diphenylacetate), (4-ethoxyphenyl)methanediol bis (diphenylacetate), and (4-hydroxyphenyl)methanediol bis (diphenylacetate).

One preferred 2-component positive-tone photoresist comprises poly (t-butyloxycarbonyloxy-styrene) or a copolymer of hydroxystyrene and t-butyloxycarbonyloxystyrene, and dimethyl-2,4-dihydroxyphenylsulfonium triflate. One preferred 3-component positive-tone photoresist comprises poly (t-butyloxycarbonyloxystyrene), bis-t-butoxycarbonyloxybisphenol A, and dimethyl-2,4-dihydroxyphenylsulfonium triflate.

As in the case of negative-tone resists, positive-tone resists according to the methods of the present invention may be formed according to techniques known to those skilled in the art. The techniques described hereinabove for forming a negative-tone photoresist may also be applied to the formation of positive-tone photoresists, as will be appreciated by those skilled in the art; the differences being that during the post-exposure baking step described above, the photoresist is heated to a sufficient temperature to provide the activation energy necessary to initiate the modification of the dissolution inhibitor or removing the protecting groups of the polymer. The modification reaction is catalyzed by the acid generated by exposure of the photoinitiators of Formula (I) to radiation. Typically, in methods of forming the positive-tone photoresist, the resist is heated at between about 75° C. and about 120° C. for between about 15 seconds and about 10 minutes. Preferably, the photoresist is heated at about 90° C. for between about 15 seconds and about 3 minutes, more preferably for about 30 seconds and about 3 minutes.

After heating the photoresist, matter is removed from the predetermined, irradiated sites to provide a positive-tone photoresist. The removal of material from the predetermined, irradiated sites may be accomplished by any means known to those skilled in the art, as described above.

The methods described herein for forming both the negative-tone photoresists and the positive-tone photoresists of the present invention may also include additional steps, known to those skilled in the art. For example, the methods of the present invention may also include etching the underlying substrate to transfer the image. Etching may also be used as a means of providing selective deposition, on the substrate or to permit the deposition of dopants into the underlying substrate. According to one preferred embodiment, etching is accomplished by plasma etching. One skilled in the art will appreciate that other finishing techniques are contemplated by the instant invention as well.

The water-soluble photoinitiators of Formula (I) provide distinct advantages over the previously known photoresists in that the photoinitiator itself may be solubilized in water during cleaning, and also in that the photoresists employing the photoinitiators of the present invention may be cast either from organic solvents or from water depending on their overall composition because the photoinitiator is soluble in both water and in organic solvents. Because the casting and organic solvents may contain water, the resulting photoresists of the present invention are more environmentally friendly and emit fewer potentially deletereous organic fumes than conventional photoresists.

The following examples are provided to illustrate the present invention, and should not be construed as limiting thereof. In these examples, "g" means grams, "ml" means milliliters, "mol" means mole(s), "mmol" means millimole (s), "nm" means nanometers, "μm" means micrometers, "mJ/cm$^2$" means millijoules per square centimeter, "hr" means hours, "° C." means degrees Centigrade, "$P_2O_5$/MSA" means phosphorus pentoxide and methanesulfonic acid, "$MgSO_4$" means magnesium sulfate, "HCl" means hydrogen chloride, "$CF_3SO_3Na$" means sodium trifluoromethane sulfonate, and "Hg—Xe" means mercury-xenon.

Dimethyl sulfoxide, resorcinol, pyrogallol, xylose and HCl gas were purchased from Aldrich Chemical Co. and used without further purification. Poly(4-hydroxystyrene) Mw=10,400 was used as received from IBM. Metal ion free aqueous-based developer (MF-312®) was used as purchased from the Shipley Co.

EXAMPLE 1

Synthesis of diethylene glycol ethylphenyl ether

Phenol (13.1 g, 0.28 mol), 15 g (0.33 mol) diethylene glycol monoethyl ether and 31.g (0.31 mol) N,N'-dicyclohexylcarbodiimide are heated for 24 hours at 100°–110° C. After cooling, the mixture is extracted with ether and dried. Evaporation of the reaction mixture and flash chromatography of the residue yields 12.6 g (30%) of phenolic ether.

EXAMPLE 2

Synthesis of tetraethylene glycol ethylphenyl ester

Phenol (15.3 g, 0.075 mol), 43 g (0.09 mol) tetraethylene glycol monoethyl ether and 36.6 g (0.083 mol) N,N'-dicyclohexylcarbodiimide are heated for 24 hours at 100°–110° C. After cooling, the mixture is extracted with ether and dried. Evaporation of the reaction mixture and flash chromatograph of the residue yields 0.66 g (65%) of phenolic ether.

EXAMPLE 3

Synthesis of tetraethylene glycol diphenyl ether

Phenol (62.5 g, 0.66 mol), 50 g (0.25 mol) tetraethylene glycol and 137.5 g (0.67 mol) dicyclohexylcarbodiimide are heated for 24 hours at 100°–110° C. After cooling, the mixture is extracted with ether and dried. Evaporation of the reaction mixture and flash chromatography of the residue yields 45 g (50%) of product.

EXAMPLE 4

Synthesis of diphenyl(monoethyldiethylene glycol) phenylsulfonium salt

To a solution of 0.25 g (1.5 mmol) diethylene glycol ethylphenyl ether and 0.3 g (1.5 mmol) diphenylsulfoxide is added 0.45 ml of $P_2O_5$/MSA reagent. The color of the solution becomes deep purple. After exotherm has subsided, the mixture is stirred at 40° C. for 3 hours and poured into 5 ml of distilled water. The produced sulfonium methylsutfonate can be converted to the active photoinitiator by adding molar equivalent of an sulfonium triflate. After stirring 30 minutes, the mixture is extracted with ether, dried over anhydrous $MgSO_4$ and filtered. The viscous liquid 0.4 g (60%) is obtained after reprecipitation into ether.

EXAMPLE 5

Synthesis of diphenyl(monoethyltetmethylene glycol)phenylsulfonium salt

To a solution of 0.23 g (0.78 mmol) tetraethylene glycol ethylphenyl ether and 0.16 g (0.78 mmol) diphenylsulfoxide is added 0.31 ml of $P_2O_5$/MSA reagent. The color of the solution becomes deep purple. After exotherm has subsided, the mixture is stirred at 40° C. for 3 hours and poured into 5 ml of distilled water. The produced sulfonium methylsulfonate can be converted to the active photoinitiator by adding molar equivalents of a sulfonium triflate. After stirring 30 minutes, the mixture is extracted with ether, dried over anhydrous $MgSO_4$ and filtered. The viscous liquid 0.21 g (43%) is obtained after reprecipitation into ether.

EXAMPLE 6

Synthesis of tetraphenyl(tetraethylene glycol diphenyl)sulfonium salt

To a solution of 1 g (2.9 mmol) tetraethylene glycol diphenyl ether and 1.17 g (5.8 mmol) diphenylsulfoxide is added 2.35 ml of $P_2O_5$/MSA reagent. The color of the solution becomes deep purple. After exotherm has subsided, the mixture is stirred at 40° C. for 3 hours and poured into 5 ml of distilled water. The produced sulfonium methylsulfonate can be converted to the active photoinitiator by adding molar equivalents of a sulfonium triflate. After stirring 30 minutes, the mixture is extracted with ether, dried over anhydrous $MgSO_4$ and filtered. The viscous liquid 1.33 g (37%) is obtained after reprecipitation into ether.

EXAMPLE 7

Synthesis of dimethylphenyl(tetraethylene glycol diphenyl)sulfonium salt

To a solution of 1 g (2.9 mmol) tetraethylene glycol diphenyl ether and 0.81 g (5.8 mmol) methylphenylsulfoxide is added 2.35 ml of $P_2O_5$/MSA reagent. The color of the solution becomes deep purple. After exotherm has subsided, the mixture is stirred at 40° C. for 3 hours and poured into 5 ml of distilled water. The produced sulfonium methylsulfonate can be converted to the active photoinitiator by adding molar equivalents of a sulfonium triflate. After stirring 30 minutes, the mixture is extracted with ether, dried over anhydrous $MgSO_4$ and filtered. The viscous liquid 1.94 g (30%) is obtained after reprecipitation into ether.

EXAMPLE 8

General preparation of dimethyl-multi-hydroxyphenylsulfonium salts

The preparation of dimethyl-2,4-dihydroxysulfonium triflate is a modification of literature synthesis described in E. Goethals et al., *Bull. Soc. Chim. Belg.* 73:546 (1964); E. Goethals et al., *Bull. Soc. Chim. Belg.* 73:579 (1964); and J.

Crivellow et al., *J. Polym. Sci., Polym. Chem. Ed.* 18:1021 (1980), the disclosures of which are incorporated herein by reference in their entirety. The general synthesis is set forth in Scheme 2 below.

Scheme 2

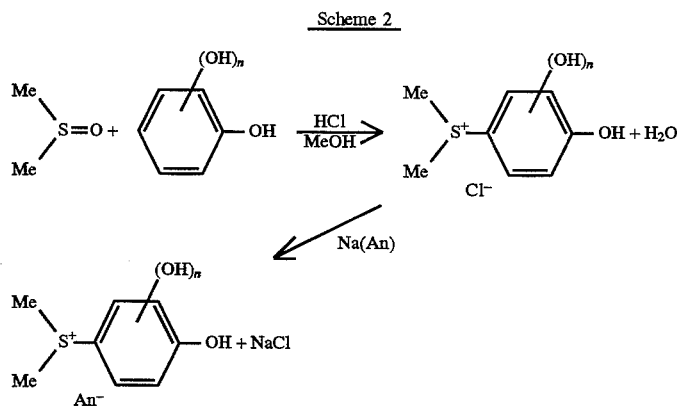

Dimethyl sulfoxide (0.173 mol) and resorcinol (0.173 mol) are dissolved in methanol (170 ml). The solution is cooled to 0°–10° C. and dry HCl gas is added slowly over the 4 hours. The sulfonium chloride crystallizes from the solution and is collected by filtration. The solid is washed with ether and the residual solvent is removed under vacuum, to give 22.8 g (64%) of the sulfonium chloride. Conversion of the chloride into the trifluoromethanesulfonate (triflate) as accomplished by stirring 1 g of the salt in 10 ml of water with 0.84 g $CF_3SO_3Na$ in 10 ml water. After 30 minutes of stirring, the solution is extracted with ethyl acetate and dried with magnesium sulfate, and the solvent is removed under reduced pressure to give 1.02 g of white solid (66%). $^1$H-NMR (300 MHz, acetone-$d_6$) δ 3.4 (s, 6H, 2CH$_3$), 6.57 (d, 1H, aromatic), 6.67 (s, 1H, aromatic), 7.62 (d, 1H, aromatic) 9.67 (s, 1H, OH), 10.73 ppm (s, 1H, OH). Anal. Calcd for $C_9H_{11}O_5S_2F_3$: C, 33.75; H, 3.44. Found: C, 33.75; H, 3.60.

The properties of several dimethyl-multihydroxyphenylsulfonium salts are reported herein below in Table I.

TABLE I

Properties of dimethyl-multihydroxyphenylsulfonium salts.

| Compound | Yield (%) | M.P °C. | UV λmax. nm (ε)* | Elemental anal. | % C | % H |
|---|---|---|---|---|---|---|
| 1 | 64 | 145–146 | 238 (2,600) 260 (2,700) 278 (2,300) | calcd found | 46.60 46.78 | 5.34 5.50 |
| 2 | 66 | 129–131 | 238 (2,600) 260 (2,700) 278 (2,300) | calcd found | 33.75 33.75 | 3.44 3.60 |
| 3 | 85 | 89–91 | 238 (2,600) 260 (2,700) 278 (2,300) | calcd found | 30.38 30.45 | 3.48 3.38 |
| 4 | 72 | 150–151 | 236 (2,500) 262 (2,600) 290 (1,600) | calcd found | 43.24 43.38 | 4.95 4.82 |
| 5 | 27 | 122–124 | 236 (2,500) 262 (2,600) 290 (1,600) | calcd found | 32.14 32.30 | 3.27 3.46 |
| 6 | 67 | 116–118 | 236 (2,500) 262 (2,600) 290 (1,600) | calcd found | 28.92 29.12 | 3.31 3.28 |

*Solvent = Methyl alcohol
1 Dimethyl-2,4-dihydroxysulfonium chloride
2 Dimethyl-2,4-dihydroxysulfonium triflate
3 Dimethyl-2,4-dihydroxysulfonium hexafluorophosphate
4 Dimethyl-2,3,4-trihydroxysulfonium chloride
5 Dimethyl-2,3,4-trihydroxysulfonium triflate
6 Dimethyl-2,3,4-trihydroxysulfonium hexafluorophosphate

EXAMPLE 9

Resist preparation and lithographic evaluation

The photoacid generator, such as dimethyl-2,4-dihydroxyphenylsulfonium triflate, is mixed with the poly (4-hydroxystyrene) and xylose in methyl cellosolve (solid content=20%). The solution is filtered and coated onto silicon wafer with a Headway spin coater (1 μm thickness). Soft baking is carried out at 80° C. for 5 minutes at hot plate. Sensitivities are determined by irradiating the coated wafer through a quartz step tablet with Hg-Xe lamp focused through an Oriel Photoresist Exposure System at 254 nm. After post-exposure baking (PEB) at appropriate times and temperatures, the irradiated films are developed in 20–30% aqueous MF-312 (Normality=0.54). The properties of various resists formulated with the dimethyl-multihydroxyphenylsulfonium salts are reported hereinbelow in Table II.

TABLE II

| | | | PEB | Sensitivity |
|---|---|---|---|---|
| ID | xylose*[4] | PAG*[2,4] | (°C./min) | (mJ/cm$^2$) |
| 1 | 5 | 5 | 120/5 | 48.7 |
| 2 | 5 | 5 | 120/10 | 38.9 |
| 3 | 5 | 5 | 130/2 | 38.9 |
| 4 | 5 | 5 | 130/5 | 30.2 |
| 5 | 5 | 10 | 120/5 | 29.2 |
| 6 | 5 | 10 | 130/2 | 25.4 |
| 7 | 5 | 10 | 130/5 | 19.5 |
| 8 | 5 | 10 | 120/5*[1-1] | 15.3 |
| 9 | 5 | 10 | 120/5*[1-2] | 17.6 |
| 10 | 5 | 10 | 120/5*[1-3] | 22.7 |
| 11 | 5 | 10*[3] | 120/5 | 75.5 |
| 12 | 5 | 10*[3] | 130/5 | 67.6 |

*[1-1,2,3]Develop: 20% MF-312, 30, 90, 120 sec.
*[2]PAG = Dimethyl-2,4-dihydroxyphenylsulfonium triflate.
*[3]PAG = Dimethyl-2,3,4-trihydroxyphenylsulfonium triflate.
*[4]wt % to the polymer

EXAMPLE 10

Effect of structure changes of Photoinitiators

The effects of structure changes in photoinitiators are shown in Table 2 above, and in FIG. 1. FIG. 1 is a graphical comparison of sensitivites for photoinitiators plotted as remaining thickness (μm) versus exposure dose (mJ/cm$^2$). For resists prepared with poly(4-hydroxystyrene)/xylose/2,4-dihydroxysulfonium salt in the ratio 100/5/10 parts, open-square-circle line represents sensitivity measurements for resists baked at 120° C. for 5 minutes and shaded-square-circle line represents sensitivity measurements for resists baked at 130° C. for 5 minutes. For resists prepared with poly(4-hydroxystyrene)/xylose/2,3,4-trihydroxysulfonium salt in the ratio 100/5/10 parts, closed-triangle line represents sensitivity measurements for resists baked at 120° C. for 5 minutes and X line represents sensitivity measurements for resists baked at 130° C. for 5 minutes.

The results indicate that 2,4-dihydroxysulfonium salt demonstrates better sensitivity than that of 2,3,4-trihydroxyphenylsulfonium salt. Without wishing to be bound by any particular theory in this regard, it is believed that this result is due to the resonance stabilization energy, of (5), which may be an intermediate obtained from the 2,3,4-trihydroxysulfonium salt by photolysis, when compared to that of (2), which may be an intermediate obtained from the 2,4-dihydroxysulfonium salt by photolysis, as shown in Scheme 3 below:

Scheme 3

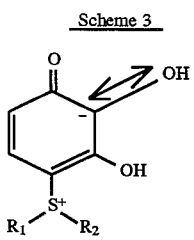

(5)

-continued
Scheme 3

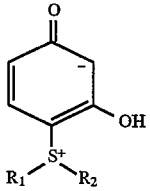

(2)

EXAMPLE 11

Effect of amount of Phominitiators

Figure 2:
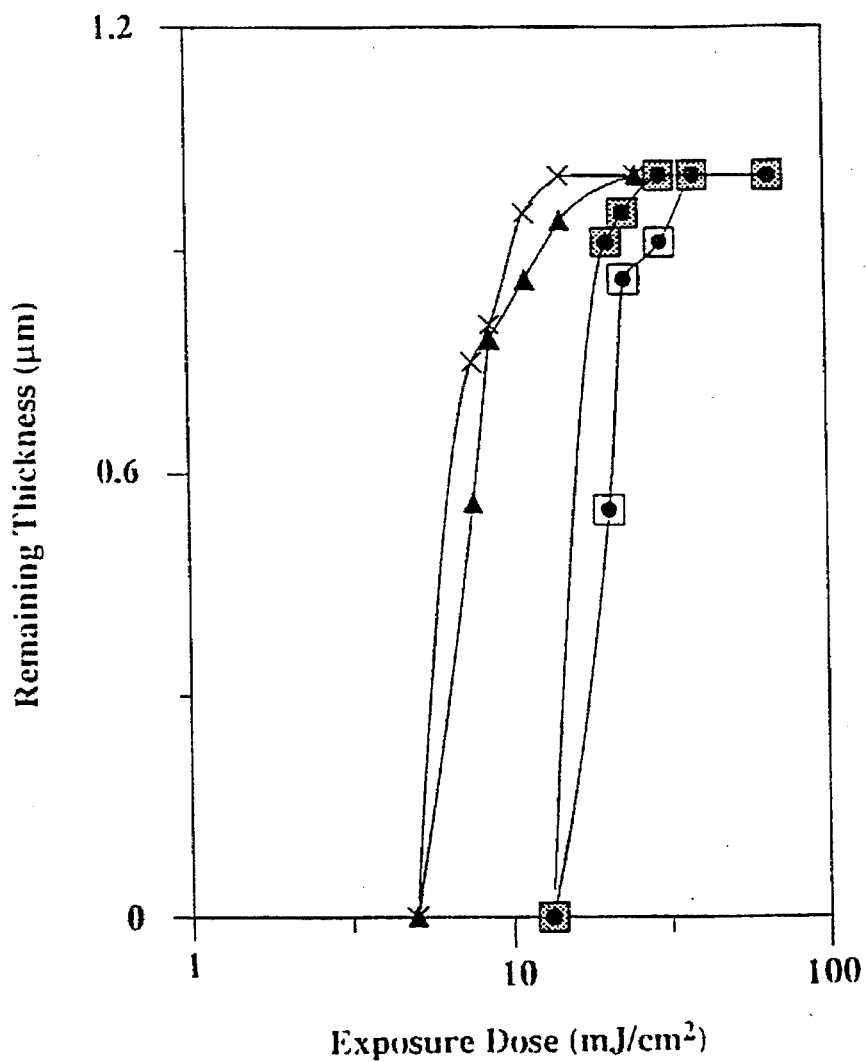
FIG. 2 is a graphical representation of the effects of amount of photoinitiator on photoresist sensitivity.

The effects of increasing the amount of photoinitiator in the photoresist are shown in Table 2 above and FIG. 2. FIG. 2 is a graphical representation of sensitivity curves for photoresists having varying amounts of photoinitiator plotted as remaining thickness (μm) versus exposure dose (mJ/cm$^2$). For resists prepared with poly(4-hydroxystyrene)/xylose/2,4-dihydroxysulfonium salt in the ratio 100/5/5 parts, open-square-circle line represents sensitivity measurements for resists baked at 130° C. for 2 minutes and shaded-square-circle line represents sensitivity measurements for resists baked at 130° C. for 5 minutes. For resists prepared with poly(4-hydroxystyrene)/xylose/2,4-dihydroxysulfonium salt in the ratio 100/5/10 parts, closed-triangle line represents sensitivity measurements for resists baked at 130° C. for 2 minutes and X line represents sensitivity measurements for resists baked at 130° C. for 5 minutes.

The results indicate that as the amount of photoinitiator is increased, the sensitivity is increased. Sensitivities were 15.3–75.5 mJ/cm$^2$ at 254 nm.

EXAMPLE 12

Effect of developer on photoresist sensitivity

Figure 3:
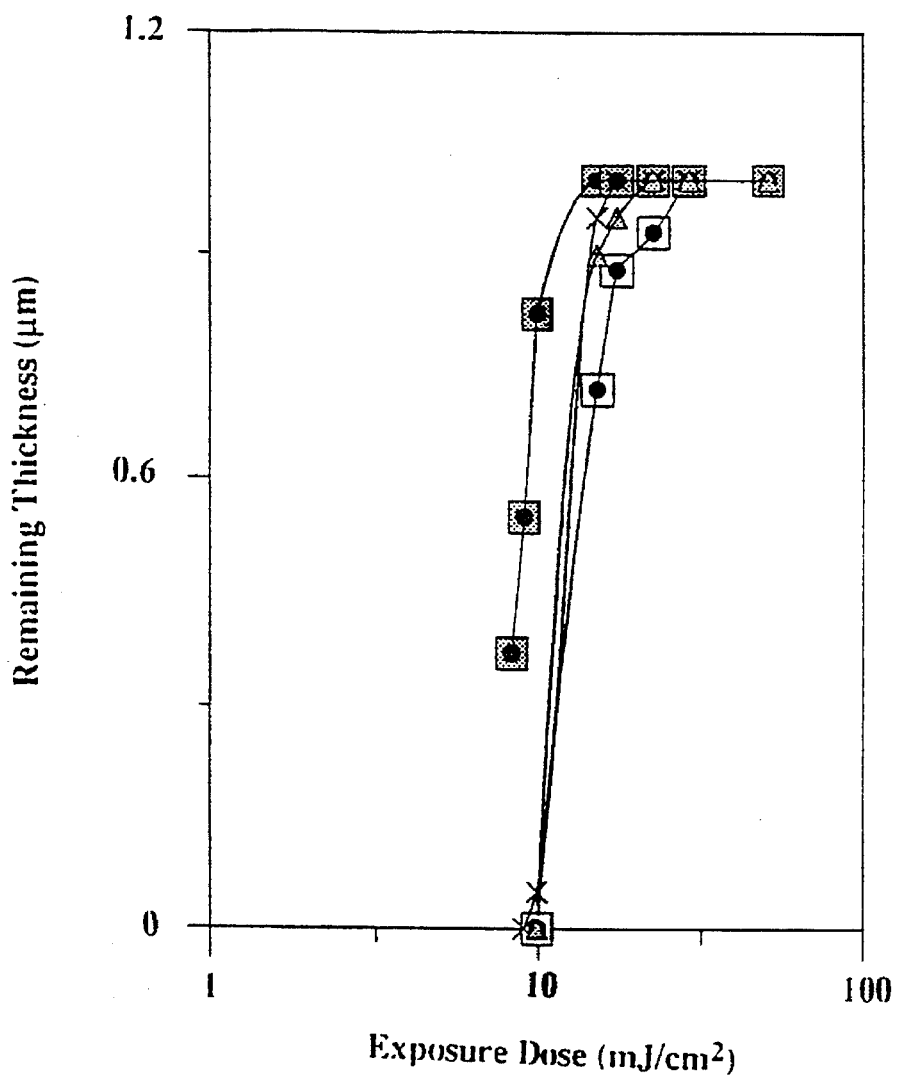
FIG. 3 is a graphical representation of the effects of various developer solutions on photoresist sensitivity.

The effects of various developer solutions on photoresist sensitivity in photoresists formulated with dimethyl-multihydroxyphenylsulfonium salts as photoinitiators are set forth in FIG. 3. FIG. 3 is a graphical representation of the effects of developers on sensitivity plotted as remaining thickness (μm) versus exposure dose (mJ/cm$^2$). For resists prepared with poly(4-hydroxystyrene)/xylose/2,4-dihydroxysulfonium salt in the ratio 100/5/10 parts and baked at 120° C. for 5 minutes, open-square-circle line represents sensitivity measurements for resists developed in 30% MF-312® for 30 seconds, shaded-square-circle line represents sensitivity measurements for resists developed in 20% MF-312® for 30 seconds, X line represents sensitivity measurements for resists developed in 20% MF-312® for 90 seconds, and shaded-triangle line represents sensitivity measurements for resists developed in 20% MF-312® for 120 seconds.

The results indicate that higher sensitivities are obtained using developer solutions possessing weakly basic conditions. Resolution of the photoresists is about 3 μm.

The foregoing is illustrative of the present invention and is not to be construed as limiting thereof. The invention is defined by the following claims with equivalents of the claims to be included therein.

That which is claimed is:

1. A negative-tone photoresist comprising a polymer, a crosslinking agent, and a water-soluble photoinitiator comprising a compound of Formula (I):

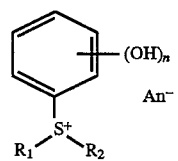

(I)

wherein R1 and R2 are independently selected from C1–C6 alkyl; n is a number from 2 to 5, and An– is an anion, wherein said photoinitiator is soluble in water.

2. The negative-tone photoresist according to claim 1, wherein $R_1$ and $R_2$ are methyl.

3. The negative-tone photoresist according to claim 1, wherein $R_1$ and $R_2$ are methyl and n is 2.

4. The negative-tone photoresist according to claim 1, wherein $R_1$ and $R_2$ are methyl and n is 3.

5. The negative-tone photoresist according to claim 1, wherein An⁻ is selected from the group consisting of halide, hexafluorophosphate, triflate, hexafluoroantimonate, hexafluoroarsenate, and tetrafluoroborate.

6. The negative-tone photoresist according to claim 1, wherein said water-soluble photoinitiator is selected from the group consisting of dimethyl-dihydroxyphenylsulfonium triflate, dimethyl-dihydroxyphenylsulfonium chloride, dimethyl-trihydroxyphenylsulfonium triflate, and dimethyl-trihydroxyphenylsulfonium chloride.

7. The negative-tone photoresist according to claim 1, wherein the polymer is selected from the group consisting of poly(hydroxystyrene), novolak, poly(dimethylhydroxystyrene), polymethacrylic acid, polyvinylbenzoic acid, poly(2-hydroxyhexafluoropropyl styrene), copolymers of styrene and maleimide, copolymers of styrene and t-butoxycarbonyloxy styrene, copolymers of hydroxystyrene and t-butoxycarbonyloxy styrene and copolymers or mixtures thereof.

8. The negative-tone photoresist according to claim 1, wherein the polymer is poly(hydroxystyrene).

9. The negative-tone photoresist according to claim 1, wherein the polymer is novolak.

10. The negative-tone photoresist according to claim 1, wherein the crosslinking agent is selected from the group consisting of poly(hydroxymethyl) aromatics, and $C_3$–$C_{12}$ water soluble sugars.

11. The negative-tone photoresist according to claim 1, wherein the crosslinking agent is selected from the group consisting of 2,6-bis-hydroxymethylphenol, 2,4-bishydroxymethylphenol, bis-hydroxymethylbisphenol A, 1,3,5-trihydroxymethyl benzene, xylose, ribose, glucose, fructose, galactose, arabinose, mannose, sucrose, maltose, lactose, and cellobiose.

12. The negative-tone photoresist according to claim 1, wherein the crosslinking agent is xylose.

13. The negative-tone photoresist according to claim 1, coated on a substrate.

14. A method of making microelectronic structures comprising the steps of:
(a) placing on a microelectronic substrate, a photoresist comprising a polymer, a crosslinking agent, and a water-soluble photoinitiator comprising a compound of Formula (I):

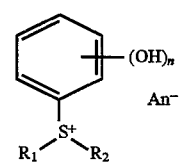

(I)

wherein R1 and R2 are independently selected from C1–C6 alkyl; n is a number from 2 to 5, and An– is an anion, wherein said photoinitiator is soluble in water;

(b) irradiating predetermined sites of said photoresist with radiation selected from the group consisting of ultraviolet light, electron beam radiation, x-ray radiation, and ion beam radiation, to activate said photoinitiator at said predetermined sites, and to create exposed and unexposed sites of said photoresist;

(c) heating said photoresist; and (d) removing matter from said unexposed sites to provide a microelectronic structure.

15. The method according to claim 14, wherein said step (a) of forming a photoresist on a microelectronic substrate comprises forming a photoresist comprising a polymer, a crosslinking agent, and a photoinitiator selected from the group consisting of dimethyl-dihydroxyphenylsulfonium triflate, dimethyl-dihydroxyphenylsulfonium chloride, dimethyl-trihydroxyphenylsulfonium triflate, and dimethyl-trihydroxyphenylsulfonium chloride.

16. The method according to claim 14, wherein said step (c) of heating said photoresist comprises heating at about 130° C. to about 140° C. for between about 30 seconds to about 5 minutes.

17. The method according to claim 14, wherein said step (d) of removing matter from said unexposed sites comprises developing said photoresist in an aqueous base solution.

18. The method according to claim 14, said method further comprising the step of etching said microelectronic structure after said step (d) of removing matter from said unexposed sites.

19. A method of making a negative-tone photoresist comprising combining a polymer, a crosslinking agent, and a water-soluble photoinitiator comprising a compound of Formula (I):

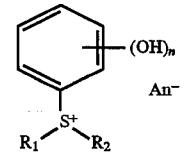

(I)

wherein R1 and R2 are independently selected from C1–C6 alkyl; n is a number from 2 to 5, and An– is an anion.

20. A positive-tone photoresist comprising a polymer, a dissolution inhibitor, and a water-soluble photoinitiator comprising a compound of Formula (I):

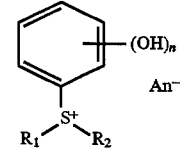

(I)

wherein R1 and R2 are independently selected from C1–C6 alkyl; n is a number from 2 to 5, and An– is an anion, wherein said photoinitiator is soluble in water.

21. The positive-tone photoresist according to claim 20, wherein $R_1$ and $R_2$ are methyl.

22. The positive-tone photoresist according to claim 20, wherein $R_1$ and $R_2$ are methyl and n is 2.

23. The positive-tone photoresist according to claim 20, wherein $R_1$ and $R_2$ are methyl and n is 3.

24. The positive-tone photoresist according to claim 20, wherein An⁻ is selected from the group consisting of halide, hexafluorophosphate, triflate, hexafluoroantimonate, hexafluoroarsenate, and tetrafluoroborate.

25. The positive-tone photoresist according to claim 20, wherein said water-soluble photoinitiator is selected from the group consisting of dimethyl-dihydroxphenylsulfonium triflate, dimethyl-dihydroxyphenylsulfonium chloride, dimethyl-trihydroxyphenylsulfonium triflate, and dimethyl-trihydroxyphenylsulfonium chloride.

26. The positive-tone photoresist according to claim 20, wherein the polymer is selected from the group consisting of poly(hydroxystyrene), novolak, poly(dimethylhydroxystyrene), polymethacrylic acid, polyvinylbenzoic acid, poly(2-hydroxyhexafluoropropyl styrene), copolymers of styrene and maleimide, copolymers of styrene and t-butoxycarbonyloxy styrene, copolymers of hydroxystyrene and t-butoxycarbonyloxy styrene, and copolymers or mixtures thereof.

27. The positive-tone photoresist according to claim 20, wherein the polymer is poly(hydroxystyrene).

28. The positive-tone photoresist according to claim 20, wherein the polymer is novolak.

29. The positive-tone photoresist according to claim 20, wherein the dissolution inhibitor is selected from the group consisting of bis-t-butoxycarbonyloxy bisphenol A, t-butyloxynaphthalene, t-butylnaphthoate, t-butylnaphthylether, t-butoxycarbonyloxy derivatives of steroids, bis-t-butyloxycarbonyloxy bisphenol A, 4,4'-bis-t-butyloxycarbonyloxy diphenylsulfone, and bis-(4-t-butyloxycarbonyloxyphenyl)phenylsulfonium hexafluoroantimonate.

30. The positive-tone photoresist according to claim 20, wherein the dissolution inhibitor is selected from the group consisting of (4-methylphenyl)methanediol dipropionate, (4-methylphenyl)methanediol dibenzoate, phenylmethanediol bis(phenylacetate), phenylmethanediol bis(diphenylacetate), (4-acetyloxyphenyl)methanediol, bis(diphenyl-acetate), phenylmethanediol bis(2,4,6-trimethylbenzoate), ((4-methoxyphenyl)methanediol bis(diphenylacetate), (4-ethoxyphenyl)methanediol bis(diphenylacetate), and (4-hydroxyphenyl)methanediol bis(diphenylacetate).

31. The positive-tone photoresist according to claim 20, wherein the dissolution inhibitor is bis-t-butyloxycarbonyloxy-bisphenol A.

32. The positive-tone photoresist according to claim 20, coated on a substrate.

33. A method of making microelectronic structures comprising the steps of:
(a) placing on a microelectronic substrate, a photoresist comprising a polymer, a dissolution inhibitor, and a water-soluble photoinitiator comprising a compound of Formula (I):

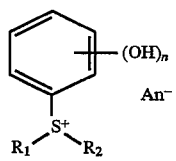

wherein R1 and R2 are independently selected from C1–C6 alkyl; n is a number from 2 to 5, and An– is an anion, wherein said photoinitiator is soluble in water;

(b) irradiating predetermined sites of said photoresist with radiation selected from the group consisting of ultraviolet light, electron beam radiation, x-ray radiation, and ion beam radiation, to activate said water-soluble photoinitiator at said predetermined sites, and to create exposed and unexposed sites of said photoresist;
(c) heating said photoresist; and
(d) removing matter from said exposed sites to provide a microelectronic structure.

34. The method according to claim 33, wherein said step (a) of forming a photoresist on a microelectronic substrate comprises forming a photoresist comprising a polymer, a dissolution inhibitor, and a photoinitiator selected from the group consisting of dimethyl-dihydroxyphenylsulfonium triflate, dimethyl-dihydroxyphenylsulfonium chloride, dimethyl-trihydroxyphenylsulfonium triflate, and dimethyl-trihydroxyphenylsulfonium chloride.

35. The method according to claim 33, wherein said step (c) of heating said photoresist comprises heating at about 90° C. for between about 15 seconds to about 3 minutes.

36. The method according to claim 33, wherein said step (d) of removing matter from said exposed sites comprises developing said photoresist in an aqueous base solution.

37. The method according to claim 33, said method further comprising the step of etching said microelectronic structure after said step (d) of removing matter from said unexposed sites.

38. A method of making a positive-tone photoresist comprising combining a polymer and a water-soluble photoinitiator comprising a compound of Formula (I):

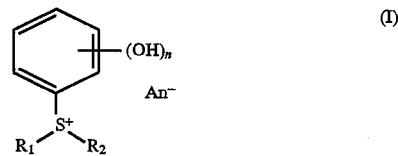

wherein R1 and R2 are independently selected from C1–C6 alkyl; n is a number from 2 to 5, and An– is an anion.

39. A positive-tone photoresist comprising a polymer, and a water-soluble photoinitiator comprising a compound of Formula (I):

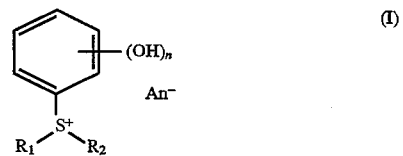

wherein R1 and R2 are independently selected from C1–C6 alkyl; n is a number from 2 to 5, and An– is an anion, wherein said photoinitiator is soluble in water.

40. A method of generating an acid in a photoresist, said method comprising exposing said photoresist to radiation selected from the group consisting of ultraviolet light, electron beam radiation, x-ray radiation, and ion beam radiation, wherein said photoresist includes a water-soluble photoinitiator of Formula (I):

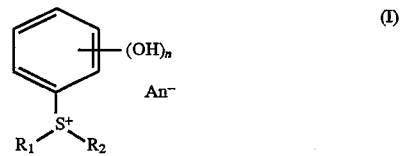

wherein $R_1$ and $R_2$ are independently selected from $C_1$–$C_6$ alkyl; n is a number from 2 to 5, and An⁻ is an anion.

41. The method according to claim 40, wherein $R_1$ and $R_2$ are methyl.

42. The method according to claim 40, wherein $R_1$ and $R_2$ are methyl and n is 2.

43. The method according to claim 40, wherein $R_1$ and $R_2$ are methyl and n is 3.

44. The method according to claim 40, wherein $An^-$ is selected from the group consisting of halide, hexafluorophosphate, triflate, hexafluoroantimonate, hexafluoroarsenate, and tetrafluoroborate.

45. The method according to claim 40, wherein said water-soluble photoinitiator is selected from the group consisting of dimethyl-dihydroxyphenylsulfonium triflate, dimethyl-dihydroxyphenylsulfonium chloride, dimethyl-trihydroxyphenylsulfonium triflate, and dimethyl-trihydroxyphenylsulfonium chloride.

* * * * *